United States Patent
Hwang

(10) Patent No.: US 12,494,413 B2
(45) Date of Patent: Dec. 9, 2025

(54) SEMICONDUCTOR DEVICE INCLUDING CONTACT STRUCTURES COMMONLY CONNECTED TO ONE OR MORE CONDUCTIVE LINES

(71) Applicant: SK hynix Inc., Icheon (KR)

(72) Inventor: Jae Wan Hwang, Icheon (KR)

(73) Assignee: SK Hynix Inc., Icheon (KR)

( * ) Notice: Subject to any disclaimer, the term of this patent is extended or adjusted under 35 U.S.C. 154(b) by 575 days.

(21) Appl. No.: 18/059,312

(22) Filed: Nov. 28, 2022

(65) Prior Publication Data
US 2023/0411244 A1    Dec. 21, 2023

(30) Foreign Application Priority Data
Jun. 17, 2022   (KR) .................. 10-2022-0073954

(51) Int. Cl.
*H01L 23/48*    (2006.01)
*H10B 63/00*    (2023.01)

(52) U.S. Cl.
CPC ........... *H01L 23/481* (2013.01); *H10B 63/00* (2023.02)

(58) Field of Classification Search
CPC . H01L 23/481; H01L 23/528; H01L 23/5283; H01L 23/5226; H01L 23/53295; H01L 23/535; H10B 63/00; H10B 61/10; H10B 63/20; H10B 63/30; H10B 63/84; H10N 70/826
See application file for complete search history.

(56) References Cited

U.S. PATENT DOCUMENTS

| | | | |
|---|---|---|---|
| 2012/0228688 A1* | 9/2012 | Matsubayashi | H10D 86/60 257/296 |
| 2014/0065789 A1* | 3/2014 | Sasago | H10B 63/82 438/382 |
| 2015/0243673 A1* | 8/2015 | Oh | H10B 43/40 365/185.11 |
| 2016/0118399 A1* | 4/2016 | Son | H10B 43/40 257/314 |
| 2019/0164991 A1* | 5/2019 | Lim | G11C 16/0483 |
| 2019/0198513 A1* | 6/2019 | Park | H10B 43/35 |
| 2020/0105768 A1* | 4/2020 | Liaw | G11C 7/18 |
| 2021/0036015 A1* | 2/2021 | Lim | H01L 23/535 |
| 2021/0210128 A1* | 7/2021 | Li | H10B 61/00 |
| 2022/0238551 A1* | 7/2022 | Petti | G11C 11/223 |
| 2022/0407000 A1* | 12/2022 | Yang | H10N 70/8616 |

FOREIGN PATENT DOCUMENTS

KR    10-2019-0087844 A    7/2019

* cited by examiner

*Primary Examiner* — Samuel Park

(57) ABSTRACT

A semiconductor device may include a substrate; a plurality of memory cells disposed between first conductive lines and second conductive lines, and disposed in intersection regions of the first conductive lines and the second conductive lines, respectively; and a contact structure disposed between the first conductive lines and the substrate, and including a plurality of upper contacts and a lower contact, the plurality of upper contacts connected to the first conductive lines, the lower contact connected to the substrate and overlapping at least one of the plurality of upper contacts when viewed in a plan view, wherein each of the plurality of upper contacts is in contact with at least two of the first conductive lines, and wherein two upper contacts, which are closest to each other, among the plurality of upper contacts are commonly in contact with one or more of the first conductive lines.

23 Claims, 11 Drawing Sheets

SEMICONDUCTOR DEVICE INCLUDING CONTACT STRUCTURES COMMONLY CONNECTED TO ONE OR MORE CONDUCTIVE LINES

CROSS-REFERENCE TO RELATED APPLICATION

This application claims priority under 35 U.S.C. § 119 to Korean Patent Application No. 10-2022-0073954 filed on Jun. 17, 2022, which is incorporated herein by reference in its entirety.

BACKGROUND

1. Technical Field

This patent document relates to semiconductor devices and their applications in electronic devices or systems.

2. Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

To use such semiconductor devices in the electronic appliances, the semiconductor devices need to be implemented in a smaller area.

SUMMARY

In an embodiment, a semiconductor device may include: a substrate; a plurality of first conductive lines disposed over the substrate and extending in a first direction; a plurality of second conductive lines disposed over or under the first conductive lines while being over the substrate, and extending in a second direction crossing the first direction, the first and the second directions being parallel to an upper surface of the substrate; a plurality of memory cells disposed between the first conductive lines and the second conductive lines in a third direction perpendicular to the first and the second directions, and disposed in intersection regions of the first conductive lines and the second conductive lines, respectively; and a contact structure disposed between the first conductive lines and the substrate in the third direction, and including a plurality of upper contacts and a lower contact, the plurality of upper contacts connected to the first conductive lines, the lower contact connected to the substrate and overlapping at least one of the plurality of upper contacts when viewed in a plan view, wherein each of the plurality of upper contacts is in contact with at least two of the first conductive lines, and wherein two upper contacts, which are closest to each other, among the plurality of upper contacts are commonly in contact with one or more of the plurality of first conductive lines.

DETAILED DESCRIPTION

Figure 1:
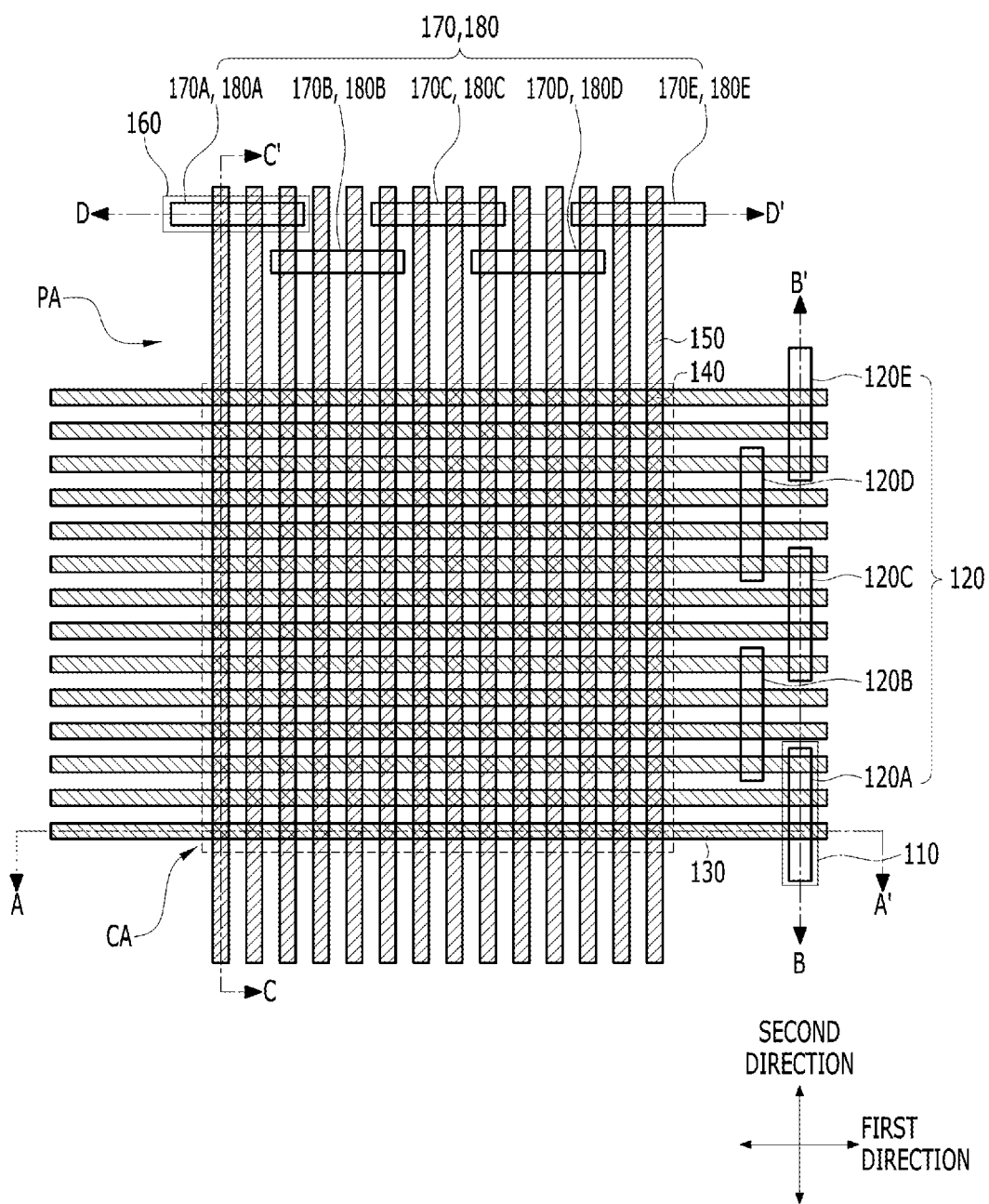
FIGS. 1 to 5 are views illustrating a semiconductor device according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
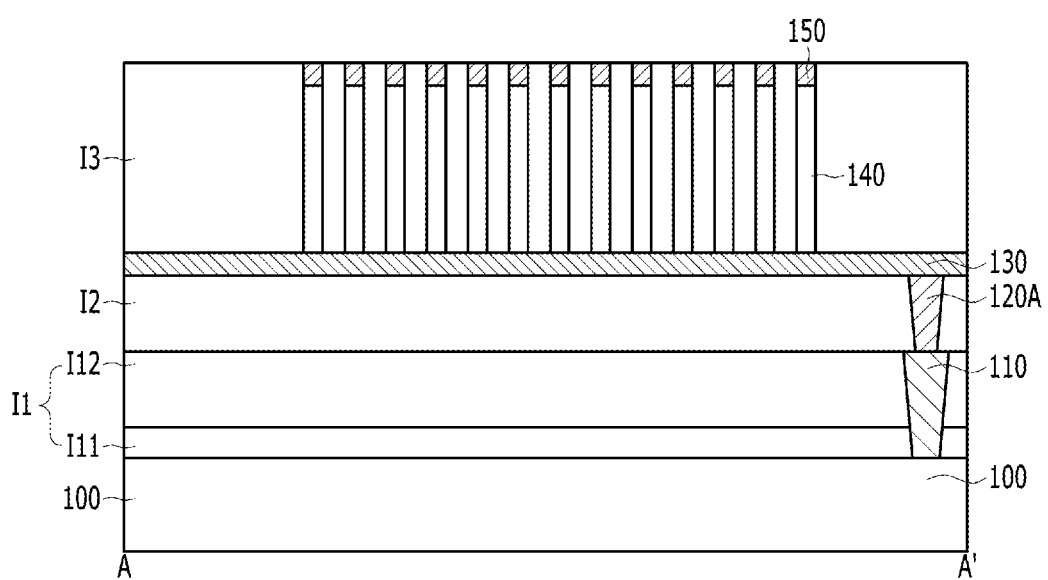
Figure 3:
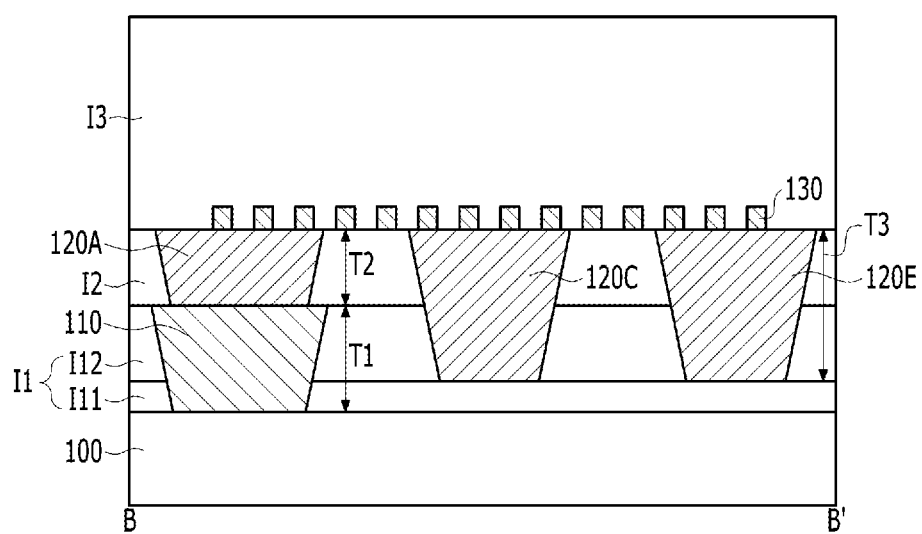
Figure 4:
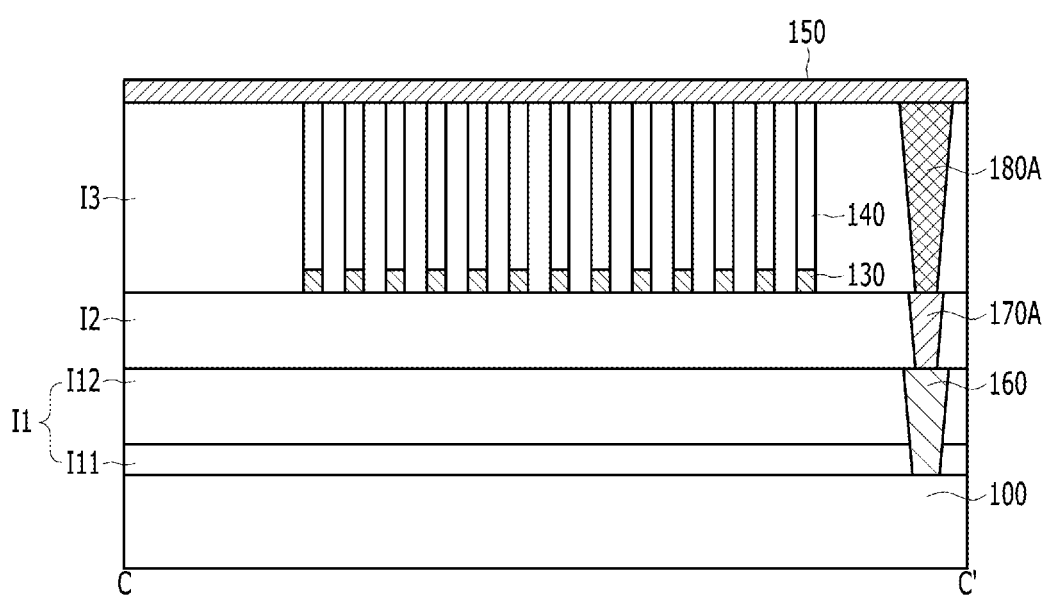
Figure 5:
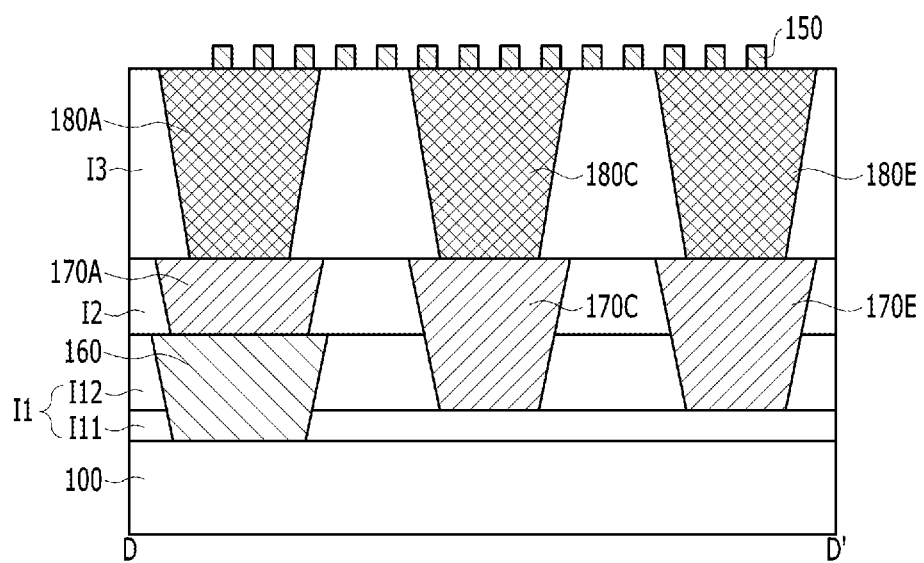

FIGS. 1 to 5 are views illustrating a semiconductor device according to an embodiment of the present disclosure. FIG. 1 is a plan view illustrating the semiconductor device according to the present embodiment, FIG. 2 is a cross-sectional view taken along a line A-A' of FIG. 1, FIG. 3 is a cross-sectional view taken along a line B-B' of FIG. 1, FIG. 4 is a cross-sectional view taken along a line C-C' of FIG. 1, and FIG. 5 is a cross-sectional view taken along a line D-D' of FIG. 1.

Referring to FIGS. 1 to 5, the semiconductor device according to the present embodiment may include a substrate 100, a plurality of first conductive lines 130 disposed over the substrate 100 in a third (or vertical) direction and extending in a first direction substantially parallel to an upper surface of the substrate 100, a plurality of second conductive lines 150 disposed over the first conductive lines 130 in the vertical direction and extending in a second direction substantially parallel to the upper surface of the substrate 100 and intersecting the first direction, and a plurality of memory cells 140 disposed between the first conductive lines 130 and the second conductive lines 150 in the vertical direction and overlapping intersection regions of the first conductive lines 130 and the second conductive lines 150. The plurality of memory cells 140 are disposed in the intersection regions, respectively. Here, the first direction and the second direction are perpendicular to the vertical direction. The first direction and the second direction may not be fixed directions and may be relative directions indicating that they intersect each other. In other words, the first conductive lines 130 may extend in the second direction and the second conductive lines 150 may extend in the first direction. In addition, for convenience of description, the first conductive lines 130 are positioned below the second conductive lines 150 in the vertical direction, but the present disclosure is not limited thereto. In another embodiment, the first conductive lines 130 may be positioned above the second conductive lines 150 in the vertical direction.

In the present disclosure, "overlapping" is used to describe a relation between corresponding elements in the plan view.

The substrate 100 may include a semiconductor material such as silicon. A desired lower structure (not shown) may be formed in the substrate 100. For example, a driving circuit for electrically connecting to the first conductive lines 130 and the second conductive lines 150 to drive them may be disposed in the substrate 100. In particular, metal lines constituting a part of the driving circuit may be disposed in the uppermost portion of the substrate 100.

The substrate 100 may include a cell area CA and a peripheral area PA. The cell area CA may be an area in which the plurality of memory cells 140 are arranged. Although only one cell area CA is illustrated in the drawings, a plurality of cell areas CA may be arranged in the semiconductor device to be spaced apart from each other in a matrix form along the first direction and the second direction. The peripheral area PA may be formed around the cell area CA, for example, to surround the cell area CA.

The plurality of first conductive lines 130 may extend in the first direction to cross the cell area CA and the peripheral area PA at both sides of the cell area CA in the first direction. The plurality of first conductive lines 130 may be arranged to be spaced apart from each other in the second direction. The first conductive line 130 may have a single-layer structure or a multi-layer structure including a conductive material, for example, a metal such as platinum (Pt), tungsten (W), aluminum (Al), copper (Cu), or tantalum (Ta), a metal nitride such as tantalum nitride (TaN) or titanium nitride (TiN), or a combination thereof.

The plurality of second conductive lines 150 may extend in the second direction to cross the cell area CA and the peripheral area PA at both sides of the cell area CA in the second direction. The plurality of second conductive lines 150 may be arranged to be spaced apart from each other in the first direction. The second conductive line 150 may have a single-layer structure or a multi-layer structure including a conductive material, for example, a metal such as platinum (Pt), tungsten (W), aluminum (Al), copper (Cu), or tantalum (Ta), a metal nitride such as tantalum nitride (TaN) or titanium nitride (TiN), or a combination thereof. When the first conductive line 130 functions as a word line, the second conductive line 150 may function as a bit line. Alternatively, when the first conductive line 130 functions as a bit line, the second conductive line 150 may function as a word line.

The plurality of memory cells 140 may be disposed in the cell area CA. This may be because the first conductive lines 130 and the second conductive lines 150 intersect only in the cell area CA, and the memory cells 140 are formed in the intersection regions of the first conductive lines 130 and the second conductive lines 150. Since the memory cell 140 has an island shape in a plan view, neighboring memory cells 140 may be separated from each other.

In an embodiment, the memory cell 140 may have a quadrangular shape in a plan view, and thus both sidewalls of the memory cell 140 in the first direction may be aligned with both sidewalls of the second conductive line 150 and both sidewalls of the memory cell 140 in the second direction may be aligned with both sidewalls of the first conductive line 130. This may be because layers for forming the memory cell 140 is patterned to have a line shape overlapping the first conductive line 130 in a process of patterning the first conductive line 130, and then line-shaped layers are patterned in a process of patterning the second conductive line 150. However, the present disclosure is not limited thereto.

In another embodiment, the memory cell 140 may be patterned separately from the first conductive line 130 and/or the second conductive line 150, and may have one of various planar shapes, such as a circular shape or the like. The memory cell 140 may have one of various layer structures and one of data storage methods as long as it can store different data according to a voltage applied through the first conductive line 130 and the second conductive line 150. An example of the memory cell 140 will be described in more detail with reference to FIG. 6 to be described later.

Referring to FIGS. 2 to 5, spaces between the first conductive lines 130, between the memory cells 140, and between the second conductive lines 150 may be filled with a third interlayer insulating layer I3. The third interlayer insulating layer I3 may be formed of one of various insulating materials, such as a silicon oxide or the like.

Here, the first conductive line 130 may be connected to a part of the substrate 100, for example, a metal line formed in the substrate 100 through a contact structure disposed below the first conductive line 130, and may receive a voltage necessary for being driven through the contact structure. In some cases, the plurality of first conductive lines 130 may receive different voltages and/or different signals, or may receive the same voltage and/or the same signal. In the present embodiment, a contact structure 110 and 120 for supplying the same voltage or the same signal to the plurality of first conductive lines 130 will be proposed as illustrated in FIGS. 1 to 3.

Referring to FIG. 1, the contact structure 110 and 120 may be disposed in the peripheral area PA at one of both sides of the cell area CA in the first direction, for example, in the peripheral area PA at the right side of the cell area CA. In addition, the contact structure 110 and 120 may include a lower contact 110 and an upper contact 120.

The upper contact 120 may be disposed under the first conductive line 130 and have an upper surface in contact with a lower surface of the first conductive line 130. Each of a plurality of upper contacts 120 may commonly overlap two or more first conductive lines 130 arranged in the second direction so that each upper contact 120 is connected to the two or more first conductive lines 130, as illustrated in FIGS. 1 and 3. Furthermore, two upper contacts 120 closest to each other in the first and the second directions, among the plurality of upper contacts 120, may commonly overlap and be connected to one or more first conductive lines 130, as illustrated in FIG. 1.

In the present embodiment, the plurality of upper contacts 120 include five upper contacts 120A to 120E. For convenience of description, the five upper contacts 120A to 120E are sequentially arranged from bottom to top in the second direction when viewed in the plan view of FIG. 1, and they will be referred to as a first upper contact 120A, a second upper contact 120B, a third upper contact 120C, a fourth upper contact 120D, and a fifth upper contact 120E.

Referring to FIG. 1, each of the first upper contact 120A and the fifth upper contact 120E may overlap and be in contact with three first conductive lines 130, and each of the second to the fourth upper contacts 120B, 120C, and 120D may overlap and be in contact with four first conductive lines 130. The first upper contact 120A and the second upper contact 120B closest to each other in the first and the second directions may commonly overlap and be in contact with one first conductive line 130. The one first conductive line 130 that commonly overlaps the first upper contact 120A and the second upper contact 120B may be one of the three first conductive lines 130 overlapping the first upper contact 120A, which is closest to the second upper contact 120B, and at the same time, the one first conductive line 130 may be one of the four first conductive lines 130 overlapping the second upper contact 120B, which is closest to the first upper contact 120A. However, the present disclosure is not limited thereto, and two or more first conductive lines 130 may commonly overlap the first upper contact 120A and the second upper contact 120B.

Similarly, the second upper contact 120B and the third upper contact 120C closest to each other in the first and the second directions may commonly overlap and be in contact with one first conductive line 130, the third upper contact 120C and the fourth upper contact 120D closest to each other in the first and the second directions may commonly overlap and be in contact with one first conductive line 130, and the fourth upper contact 120D and the fifth upper contact 120E closest to each other in the first and the second directions may commonly overlap and be in contact with one first conductive line 130.

Meanwhile, in order for two neighboring upper contacts 120 to overlap and be in contact with one or more first conductive lines 130 in common, the two neighboring upper contacts 120 may not be positioned on a straight line extending in the second direction while being positioned apart from each other in the first direction. As illustrated in FIG. 1, the second upper contact 120B may be disposed to be spaced apart from the first upper contact 120A by a predetermined distance at one side of the first upper contact 120A in the first direction, for example, at a left side of the first upper contact 120A when viewed in the plan view.

Similarly, the third upper contact 120C may be disposed to be spaced apart from the second upper contact 120B by a predetermined distance at one side of the second upper contact 120B in the first direction, for example, at a right side of the second upper contact 120B when viewed in the plan view. Similarly, the fourth upper contact 120D may be disposed to be spaced apart from the third upper contact 120C by a predetermined distance at one side of the third upper contact 120C in the first direction, for example, at a left side of the third upper contact 120C when viewed in the plan view. Similarly, the fifth upper contact 120E may be disposed to be spaced apart from the fourth upper contact 120D by a predetermined distance at one side of the fourth upper contact 120D in the first direction, for example, at a right side of the fourth upper contact 120D when viewed in the plan view.

For example, the first to fifth upper contacts 120A, 120B, 120C, 120D, and 120E may be arranged in a zigzag shape along the second direction, and thus, odd-number upper contacts, i.e., the first, the third, and the fifth upper contacts 120A, 120C, and 120E, may be located on a first straight line extending in the second direction, for example, the line B-B', and even-number upper contacts, i.e., the second and the fourth upper contacts 120B and 120D, may be located on a second straight line spaced apart from the line B-B' in the first direction while extending in the second direction.

Each of the plurality of upper contacts 120 may have a bar shape having a relatively long length in the second direction and a relatively short length in the first direction. That is, each upper contact 120 has a bar shape extending in the second direction. In this case, a distance between two neighboring upper contacts 120 in the first direction may be reduced, so that an area occupied by the plurality of upper contacts 120 may be reduced. Furthermore, in the present embodiment, planar shapes of the first to the fifth upper contacts 120A, 120B, 120C, 120D, and 120E may be substantially the same as each other. However, the present disclosure is not limited thereto. In another embodiment, at least one of the first to fifth upper contacts 120A, 120B, 120C, 120D, and 120E may have a different planar shape from the others.

The lower contact 110 may be disposed under at least one of the plurality of upper contacts 120. The lower contact 110 may have a lower surface in contact with the substrate 100, particularly in contact with the metal line of the substrate 100. An shown in FIG. 3, the lower contact 110 may be interposed between at least one of the plurality of upper contacts 120 and the substrate 100 to electrically connect them, and the lower contact 110 may not exist under the rest of the plurality of upper contacts 120. Accordingly, an insulating material may be interposed between the rest of the plurality of upper contacts 120 and the substrate 100.

Referring to FIGS. 1 to 3, the lower contact 110 is disposed under the first upper contact 120A. The lower contact 110 may overlap and be connected to the first upper contact 120A, and may have an upper surface that contacts a lower surface of the first upper contact 120A. However, the present disclosure is not limited thereto.

In another embodiment, the lower contact 110 may be disposed under at least one of the second to the fifth upper contacts 120B, 120C, 120D, and 120E instead of the first upper contact 120A, or the lower contact 110 may be disposed under each of the first to fifth upper contacts 120A, 120B, 120C, 120D, and 120E. However, an increase in the number of lower contacts 110 means that the number of metal lines, connected to the lower contacts 110, in the substrate 100 and/or an area occupied by the metal lines increases. In other words, as the number of lower contacts 110 decreases, the number of metal lines and/or the area occupied by the metal lines in the substrate 100 may decrease. When the area occupied by the metal lines connected to the lower contacts 110 is reduced, metal lines for other uses may be formed in the remaining area, and consequently, an area of the semiconductor device may be reduced. Accordingly, when one lower contact 110 is formed, the number of lower contacts 110 may be smaller than the number of upper contacts 120.

Each of the upper contact 120 and the lower contact 110 may include one of various conductive materials, for example, a metal such as platinum (Pt), tungsten (W), aluminum (Al), copper (Cu), or tantalum (Ta), a metal nitride such as tantalum nitride (TaN) or titanium nitride (TiN), or a combination thereof.

According to the connections among the lower contact 110, the upper contacts 120, and the first conductive lines 130 described above, a voltage or signal supplied from the substrate 100 may be transferred to the three first conductive lines 130 connected to the first upper contact 120A through the lower contact 110 connected to the substrate 100 and the first upper contact 120A connected to the lower contact 110. Since one of the three first conductive lines 130 connected to the first upper contact 120A is connected to the second upper contact 120B, this voltage may be transferred to the second upper contact 120B. Accordingly, this voltage may also be transferred to the four first conductive lines 130 connected to the second upper contact 120B. Also, since one of the four first conductive lines 130 connected to the second upper contact 120B is also connected to the third upper contact 120C, this voltage may be transferred to the third upper contact 120C, and accordingly, may also be transferred to the four first conductive lines 130 connected to the third upper contact 120C. Also, since one of the four first conductive lines 130 connected to the third upper contact 120C is connected to the fourth upper contact 120D, this voltage may be transferred to the fourth upper contact 120D, and accordingly, may also be transferred to the four first conductive lines 130 connected to the fourth upper contact 120D. Also, since one of the four first conductive lines 130 connected to the fourth upper contact 120D is connected to the fifth upper contact 120E, this voltage may be transferred to the fifth upper contact 120E, and accordingly, may also be transferred to the three first conductive lines 130 connected to the fifth upper contact 120E.

In summary, a voltage or signal supplied from the substrate 100 may be transferred to the first upper contact 120A connected to the lower contact 110, Since the first to the fifth upper contacts 120A, 120B, 120C, 120D, and 120E form a kind of voltage or signal transfer chain, the voltage or signal may be transferred to the first to the fifth upper contacts 120A, 120B, 120C, 120D, and 120E and the first conductive lines 130 in contact with the first to the fifth upper contacts 120A, 120B, 120C, 120D, and 120E. As a result, the same voltage or the same signal may be transferred to all of the first conductive lines 130.

A method of forming the lower contact 110 and the upper contacts 120 will be briefly described below.

First, a first interlayer insulating layer I1 may be formed over the substrate 100 by depositing an insulating material, and then the lower contact 110 may be formed by selectively etching the first interlayer insulating layer I1 until a part of the substrate 100, for example, the metal line of the substrate 100, is exposed to form a hole providing a space for the lower contact 110 to be formed and filling the hole with a conductive material. As a result, the lower contact 110 may be formed to penetrate the first interlayer insulating layer I1, and a thickness T1 of the lower contact 110 may be substantially the same as a thickness of the first interlayer insulating layer I1.

Next, a second interlayer insulating layer I2 may be formed over the first interlayer insulating layer I1, in which the lower contact 110 is formed, by depositing an insulating material, and the upper contacts 120 may be formed by selectively etching the second interlayer insulating layer I2 to form holes providing spaces for the upper contacts 120 to be formed and filling the holes with a conductive material. Here, the etching process for forming the holes may be performed until the upper surface of the lower contact 110 is exposed. Accordingly, the hole for forming the first upper contact 120A positioned over the lower contact 110 may have a lower surface positioned at substantially the same level as the upper surface of the lower contact 110. After that, the first upper contact 120A may be formed to penetrate the second interlayer insulating layer I2 by filling the hole with a conductive material, and a thickness T2 of the first upper contact 120A may be substantially the same as a thickness of the second interlayer insulating layer I2.

On the other hand, since the lower contact 110 does not exist under the second to fifth upper contacts 120B, 120C, 120D, and 120E, over-etching may occur when performing the etching process for forming the holes. As a result, the hole for forming each of the second to the fifth upper contacts 120B, 120C, 120D, and 120E may have a lower surface positioned below the upper surface of the lower contact 110. Accordingly, as shown in FIG. 3, a thickness T3 of each of the second to the fifth upper contacts 120B, 120C, 120D, and 120E may be greater than the thickness T2 of the first upper contact 120A. Each of the second to the fifth upper contacts 120B, 120C, 120D, and 120E may be formed to penetrate a portion of the first interlayer insulating layer I1 as well as fully penetrating the second interlayer insulating layer I2. Since the second to the fifth upper contacts 120B, 120C, 120D, and 120E penetrate the portion of the first interlayer insulating layer I1, the other portion of the first interlayer insulating layer I1 may remain under each of the second to the fifth upper contacts 120B, 120C, 120D, and 120E. A thickness of the other portion of the first interlayer insulating layer I1 may correspond to a difference between T3 and (T1+T2).

When the over-etching occurs during the formation of the holes for the second to the fifth upper contacts 120B, 120C, 120D, and 120E, the substrate 100 may be unintentionally exposed and thus the second to the fifth upper contacts 120B, 120C, 120D, and 120E may be connected to the substrate 100. To prevent this, the first interlayer insulating layer I1 may include a stacked structure of a first insulating layer I11 and a second insulating layer I12. The first insulating layer I11 may function as an etch stop layer when forming the holes for the second to the fifth upper contacts 120B, 120C, 120D, and 120E, and thus the first insulating layer I11 includes a material having a lower etch rate than the second insulating layer I12. For example, when the second insulating layer I12 includes silicon oxide, the first insulating layer I11 may include silicon nitride. The second interlayer insulating layer I2 may include the same material as the second insulating layer I12, for example, silicon oxide. In this case, the first upper contact 120A may penetrate the second interlayer insulating layer I2, and the second to the fifth upper contacts 120B, 120C, 120D, and 120E may penetrate the second interlayer insulating layer I2 and the second insulating layer I12 by the over-etching. However, the present disclosure is not limited thereto.

In another embodiment, the first insulating layer I11 serving as the etch stop layer may be omitted so that the first interlayer insulating layer I1 may be formed as a single layer. When the first insulating layer I11 is omitted, the holes for the second to the fifth upper contacts 120B, 120C, 120D, and 120E may be formed not to expose the substrate 100 by appropriately adjusting etching conditions. In some embodiments, the first interlayer insulating layer I1 and the second interlayer insulating layer I2 may be formed of the same material or different materials, and each of the first interlayer insulating layer I1 and the second interlayer insulating layer I2 may have a single-layer structure or a multi-layer structure.

Similarly, the second conductive line 150 may be connected to a part of the substrate 100, for example, a metal line formed in the substrate 100 through a contact structure disposed below the second conductive line 150, and may receive a voltage necessary for being driven through the contact structure. In some cases, the plurality of second conductive lines 150 may receive different voltages and/or different signals, or may receive the same voltage and/or the same signal. In the present embodiment, a contact structure 160, 170, and 180 for supplying the same voltage or the same signal to the plurality of second conductive lines 150 will be proposed as illustrated in FIGS. 1, 4, and 5.

Referring to FIG. 1, the contact structure 160, 170, and 180 may be disposed in the peripheral area PA at one of both sides of the cell area CA in the second direction, for example, in the peripheral area PA at the upper side of the cell area CA. The contact structure 160, 170, and 180 may include a lower contact 160, an intermediate contact 170, and an upper contact 180. In the present embodiment, since the second conductive lines 150 are positioned above the first conductive lines 130, the contact structure 160, 170, and 180 may have a three-layer structure, unlike the contact structure 110 and 120 having a two-layer structure. Hereinafter, the contact structure 160, 170, and 180 will be described with a focus on differences from the contact structure 110 and 120.

The upper contact 180 may be disposed under the second conductive line 150 and have an upper surface in contact with a lower surface of the second conductive line 150. Each of a plurality of upper contacts 180 may commonly overlap and be in contact with two or more second conductive lines 150 arranged in the first direction so that each upper contact 180 is connected to the two or more second conductive lines 150, as illustrated in FIGS. 1 and 5. Furthermore, two upper contacts 180 closest to each other in the first and the second directions, among the plurality of upper contacts 180, may commonly overlap and be commonly connected to one or more second conductive lines 150.

In the present embodiment, five upper contacts 180, that is, a first upper contact 180A, a second upper contact 180B, a third upper contact 180C, a fourth upper contact 180D, and a fifth upper contact 180E may be sequentially arranged from left to right in the first direction when viewed in the plan view. In order for two upper contacts 180 closest to each other to overlap and be in contact with one or more second conductive lines 150 in common, the two upper contacts 180 closest to each other may not be positioned on a straight line extending in the first direction while being positioned apart from each other in the second direction.

For example, as illustrated in FIG. 1, the first to the fifth upper contacts 180A, 180B, 180C, 180D, and 180E may be arranged in a zigzag shape along the first direction, and thus, the first, the third, and the fifth upper contacts 180A, 180C, and 180E may be located on a straight line extending in the first direction, for example, the line D-D', and the second and the fourth upper contacts 180B and 180D may be located on another straight line different from the line D-D' while extending in the first direction. Each of the plurality of upper contacts 180 may have a bar shape having a relatively long length in the first direction and a relatively short length in the second direction in a plan view or have a shape similar to the bar shape. That is, each upper contact 180 has a bar shape extending in the first direction.

The lower contact 160 may be disposed under at least one of the plurality of upper contacts 180. The lower contact 160 may have a lower surface in contact with the substrate 100, particularly in contact with the metal line of the substrate 100. The lower contact 160 may be electrically connected to the upper contact 180 via the intermediate contact 170 to be described later. When the lower contact 160 is disposed under one of the plurality of upper contacts 180, the lower contact 160 may not exist under the rest of the plurality of upper contacts 180. In the present embodiment, the case in which the lower contact 160 is disposed under the first upper contact 180A is illustrated in FIGS. 1, 4, and 5.

In the present embodiment, the intermediate contact 170 may be disposed under each of the plurality of upper contacts 180. Referring to FIG. 1, first to fifth intermediate contacts 170A, 170B, 170C, 170D, and 170E overlap and are connected to the first to fifth upper contacts 180A, 180B, 180C, 180D, and 180E, respectively. Upper surfaces of the first to the fifth intermediate contacts 170A, 170B, 170C, 170D, and 170E may be in contact with lower surfaces of the first to the fifth upper contacts 180A, 180B, 180C, 180D, and 180E, respectively, as illustrated in FIG. 5.

As described above, since the lower contact 160 is disposed under the first upper contact 180A, the first intermediate contact 170A may be interposed between the first upper contact 180A and the lower contact 160 in the vertical direction. On the other hand, the lower contact 160 may not exist under the second to the fifth intermediate contacts 170B, 170C, 170D, and 170E as illustrated in FIG. 5. However, the present disclosure is not limited thereto. In another embodiment, the rest of the intermediate contacts 170, except for the first intermediate contact 170A overlapping the lower contact 160, may be omitted. For example, except for the first intermediate contact 170A, at least one of the second to the fifth intermediate contacts 170B, 170C, 170D, and 170E may be omitted, i.e., may not be formed.

In the stacked structure of the lower contact 160, the first intermediate contact 170A, the first upper contact 180A, and the second conductive lines 150, a voltage or signal supplied from the substrate 100 may be transferred to the second conductive lines 150 via the lower contact 160, the first intermediate contact 170A, and the first upper contact 180A, and the first to the fifth upper contacts 180A, 180B, 180C, 180D, and 180E and the first to the fifth intermediate contacts 170A, 170B, 170C, 170D, and 170E may form a kind of voltage or signal transfer chain so that the same voltage or the same signal may be transferred to all of the second conductive lines 150.

A method of forming the lower contact 160, the intermediate contacts 170, and the upper contacts 180 will be briefly described below.

Referring to FIG. 5, the first interlayer insulating layer I1 may be formed over the substrate 100 by depositing an insulating material, and then the lower contact 160 may be formed by selectively etching the first interlayer insulating layer I1 to form a hole providing a space for the lower contact 160 to be formed and filling the hole with a conductive material. As a result, the lower contact 160 may be formed to penetrate the first interlayer insulating layer I1, and a thickness of the lower contact 160 may be substantially the same as the thickness of the first interlayer insulating layer I1. The process of forming the lower contact 160 may be performed simultaneously with the above-described process of forming the lower contact 110.

Next, the second interlayer insulating layer I2 may be formed over the first interlayer insulating layer I1, in which the lower contact 160 is formed, by depositing an insulating material, and the intermediate contact 170 may be formed by selectively etching the second interlayer insulating layer I2 to form a hole providing a space for the intermediate contact 170 to be formed and filling the hole with a conductive material. Here, the etching process for forming the hole may be performed until an upper surface of the lower contact 160 is exposed. Accordingly, the hole for forming the first intermediate contact 170A positioned over the lower contact 160 may have a lower surface positioned at substantially the same level as the upper surface of the lower contact 160. After that, the first intermediate contact 170A may be formed to penetrate the second interlayer insulating layer I2, and thus a thickness of the first intermediate contact 170A may be substantially the same as the thickness of the second interlayer insulating layer I2.

On the other hand, since the lower contact 160 may not exist under the second to the fifth intermediate contacts 170B, 170C, 170D, and 170E, over-etching may occur during the etching process for forming the hole in which the first intermediate contact 170A is to be formed. Accordingly, a thickness of each of the second to the fifth intermediate contacts 170B, 170C, 170D, and 170E may be greater than the thickness of the first intermediate contact 170A. Each of the second to the fifth intermediate contacts 170B, 170C, 170D, and 170E may be formed to penetrate a portion of the first interlayer insulating layer I1 as well as fully penetrating the second interlayer insulating layer I2. The process of forming the intermediate contact 170 may be performed simultaneously with the above-described process of forming the upper contact 120.

Next, a third interlayer insulating layer I3 may be formed over the second interlayer insulating layer I2, in which the intermediate contact 170 is formed, by depositing an insulating material, and the upper contact 180 may be formed by selectively etching the third interlayer insulating layer I3 to form a hole providing a space for the upper contact 180 to be formed and filling the hole with a conductive material. Here, the etching process for forming the hole may be performed until an upper surface of the intermediate contact 170 is exposed. In the present embodiment, since the first to the fifth intermediate contacts 170A, 170B, 170C, 170D, and 170E are respectively located below the first to the fifth upper contacts 180A, 180B, 180C, 180D, and 180E, the first to the fifth upper contacts 180A, 180B, 180C, 180D, and 180E may be formed to penetrate the third interlayer insulating layer I3 and may have substantially the same thickness. That is, the first to the fifth upper contacts 180A, 180B, 180C, 180D, and 180E may have substantially the same thickness as a thickness of the third interlayer insulating layer I3.

Meanwhile, as described above, at least one of the second to the fifth intermediate contacts 170B, 170C, 170D, and 170E may be omitted. In this case, since over-etching may occur when forming the hole for forming at least one of the second to the fifth upper contacts 180B, 180C, 180D, and 180E under which the intermediate contact 170 is not formed, the at least one of the second to the fifth upper contacts 180B, 180C, 180D, and 180E may have a lower surface positioned below a lower surface of the first upper contact 180A, and thus, may have a thickness greater than a thickness of the first upper contact 180A.

Although not shown, in order to supply different voltages or different signals to the plurality of first conductive lines 130, contact structures respectively connected to the plurality of first conductive lines 130 may be formed. That is, these contact structures and the first conductive lines 130 may correspond to each other one-to-one. These contact structures may be formed in an area different from the area in which the contact structure 110 and 120 is formed. For example, these contact structures may be formed at the left side of the cell area CA in the first direction when viewed in the plan view of FIG. 1.

Similarly, in order to supply different voltages or different signals to the plurality of second conductive lines 150, contact structures respectively connected to the plurality of second conductive lines 150 may be formed. That is, these contact structures and the second conductive lines 150 may correspond to each other one-to-one. These contact structures may be formed in an area different from the area in which the contact structure 160, 170, and 180 is formed. For example, these contact structures may be formed at the lower side of the cell area CA in the second direction when viewed in the plan view of FIG. 1.

According to the semiconductor device described above, since an upper contact and a lower contact of a contact structure for transmitting the same signal or the same voltage to a plurality of conductive lines have a shape overlapping at least two of the plurality of conductive lines, the difficulty of the manufacturing process may be reduced, compared to a case of forming a contact overlapping and connected to each of the plurality of conductive lines. This may be because a contact overlapping and connected to two or more conductive lines may have a larger size and a larger pitch than a contact overlapping and connected to each of the conductive lines.

In addition, since a plurality of upper contacts in contact with a plurality of conductive lines may be connected in a chain form and a lower contact may be disposed only under a selected one of the plurality of upper contacts to be connected to a metal line of a substrate, it is possible to reduce the number and/or area of metal lines connected to the lower contact. As a result, the area of the semiconductor device may be reduced.

Figure 6:
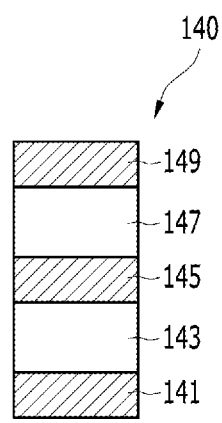
FIG. 6 is a cross-sectional view illustrating an example of a memory cell of FIGS. 1 to 5.

FIG. 6 is a cross-sectional view illustrating the memory cell 140 of FIGS. 1 to 5.

Referring to FIG. 6, the memory cell 140 may include a variable resistance element that stores data by switching in different resistance states. For example, the memory cell 140 may include a stacked structure of a lower electrode layer 141, a selector layer 143, an intermediate electrode layer 145, a variable resistance layer 147, and an upper electrode layer 149.

The lower electrode layer 141 and the upper electrode layer 149 may be located at both ends of the memory cell 140, for example, at the lower end and the upper end, respectively, and may apply a voltage required for an operation of the memory cell 140. The intermediate electrode layer 145 may electrically connect the selector layer 143 and the variable resistance layer 147 while physically separating them from each other. The lower electrode layer 141, the intermediate electrode layer 145, or the upper electrode layer 149 may include one of various conductive materials, for example, a metal such as platinum (Pt), tungsten (W), aluminum (Al), copper (Cu), or tantalum (Ta), a metal nitride such as tantalum nitride (TaN) or titanium nitride (TiN), or a combination thereof. Alternatively, the lower electrode layer 141, the intermediate electrode layer 145, or the upper electrode layer 149 may be a carbon electrode.

The selector layer 143 may prevent or reduce current leakage between memory cells 140. The current leakage may occur because the memory cells 140 share the first conductive line 130 or the second conductive line 150 described above. To this end, the selector layer 143 may have a threshold switching characteristic, that is, a characteristic for blocking or substantially limiting a flow of current in the memory cell 140 when a magnitude of an applied voltage is less than a predetermined threshold value of the memory cell 140 and a characteristic for allowing lots of current to abruptly flow in the memory cell 140 when the magnitude of the applied voltage is equal to or greater than the threshold value. The threshold value may be referred to as a threshold voltage, and the selector layer 143 may be implemented in a turned-on state or a turned-off state based on the threshold voltage. The selector layer 143 may include a diode, an ovonic threshold switching (OTS) material such as a chalcogenide-based material, a mixed ionic electronic conducting (MIEC) material such as a metal-containing chalcogenide-based material, a metal insulator transition (MIT) material such as $NbO_2$, $VO_2$, or the like, or a tunneling insulating layer having a relatively wide band gap, such as $SiO_2$, $Al_2O_3$, or the like.

The variable resistance layer 147 may be an element that stores data in the memory cell 140. To this end, the variable resistance layer 147 may have a variable resistance characteristic that switches between different resistance states according to the applied voltage. The variable resistance layer 147 may have a single-layer structure or a multi-layer structure including at least one of materials used for an RRAM, a PRAM, an MRAM, an FRAM, and the like, that is, a metal oxide such as a perovskite-based oxide or a transition metal oxide, a phase change material such as a chalcogenide-based material, a ferromagnetic material, a ferroelectric material, or the like.

However, the memory cell is not limited to the illustrated structure 140, and various modifications of the memory cell 140 may be made. As long as the memory cell 140 includes the variable resistance layer 147 necessary for data storage, at least one of the other layers may be omitted. That is, at least one of the lower electrode layer 141, the intermediate electrode layer 145, the upper electrode layer 149, and the selector layer 143 may be omitted. Alternatively, positions of the variable resistance layer 147 and the selector layer 143 may be reversed. That is, the selector layer 143 may be disposed above the variable resistance layer 147. Alternatively, one or more layers (not shown) may be added to the memory cell 140 to facilitate the manufacturing process of the memory cell 140 or to improve characteristics of the memory cell 140.

Meanwhile, in the above-described embodiment, one layer of the memory cells 140 has been described, but the present disclosure is not limited thereto. In another embodiment, two or more layers of memory cells may be stacked in the vertical direction. This case will be exemplarily described with reference to FIGS. 7 to 11.

Figure 7:
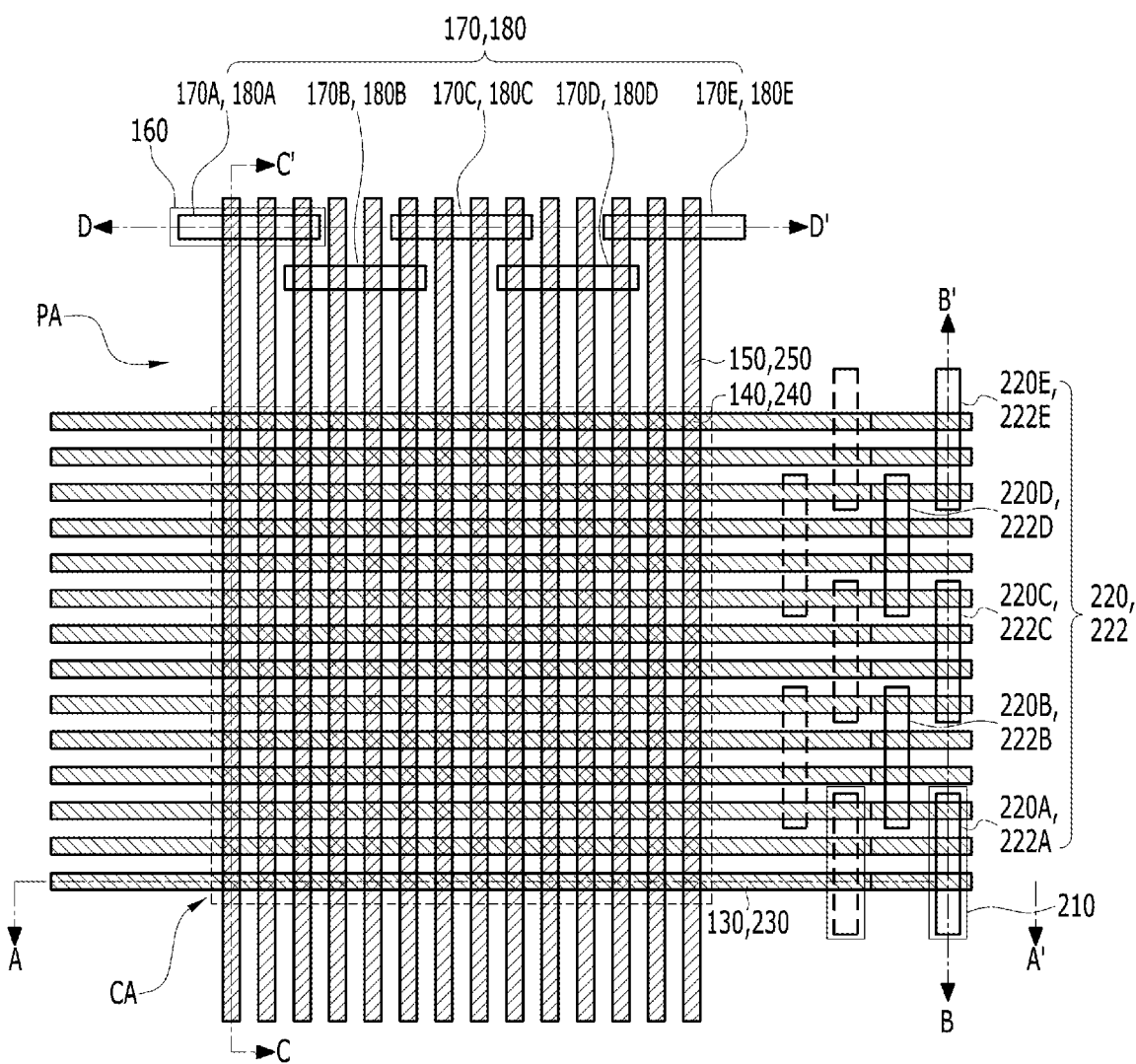
FIGS. 7 to 11 are views illustrating a semiconductor device according to another embodiment of the present disclosure.
Figure 8:
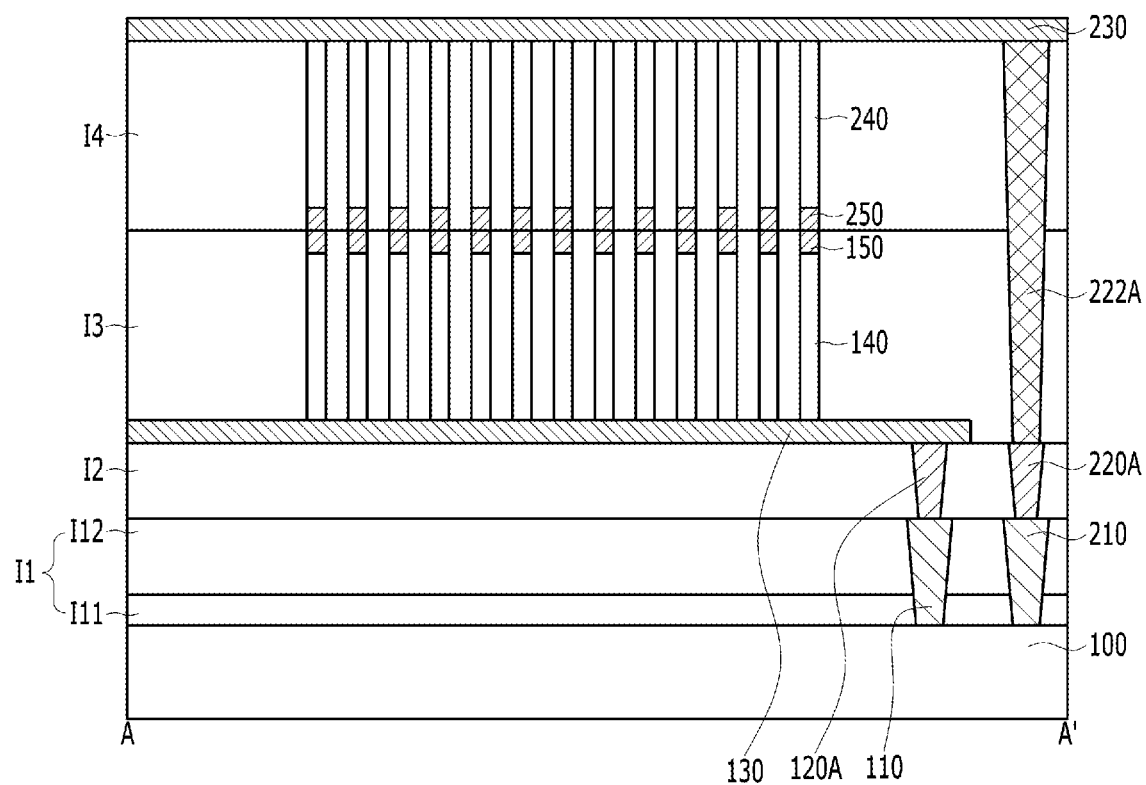
Figure 9:
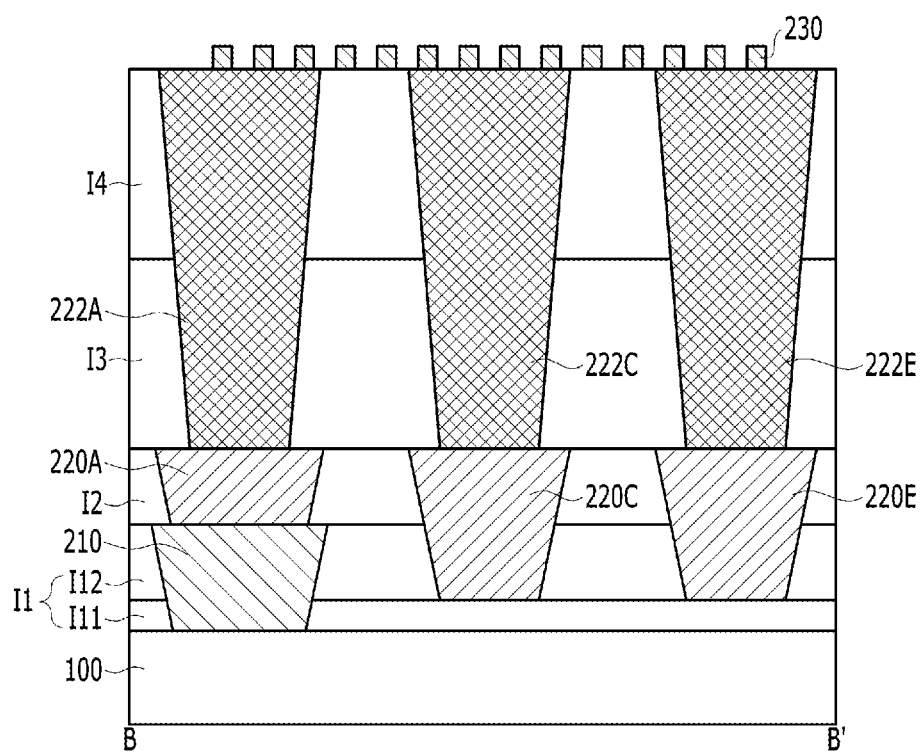
Figure 10:
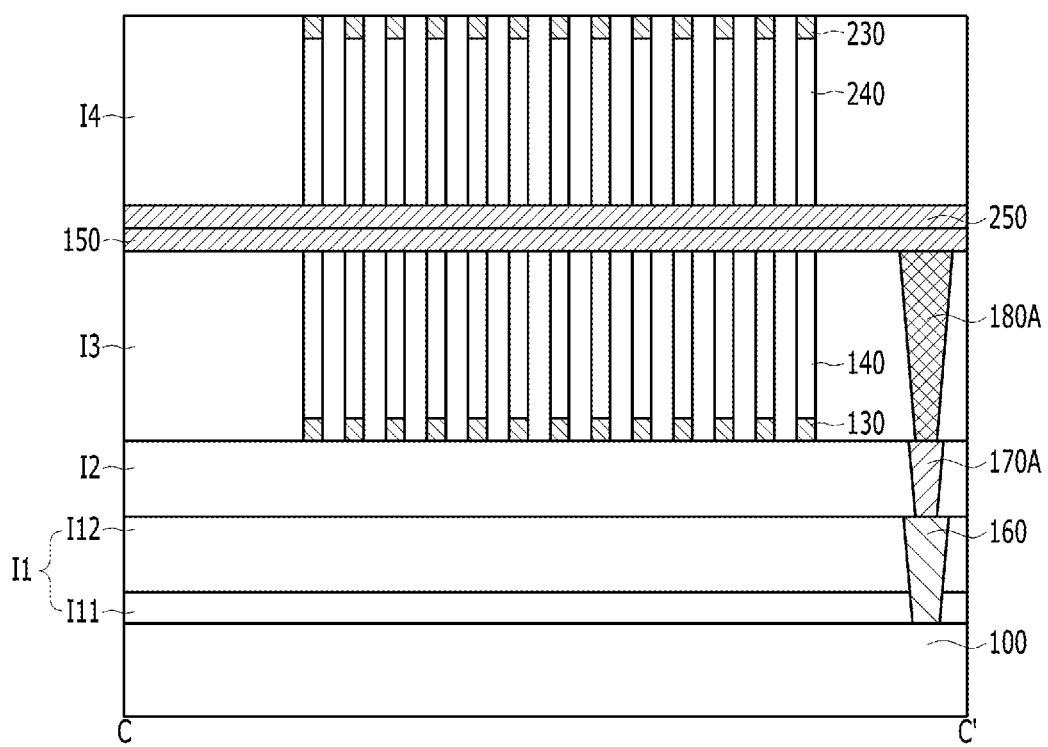
Figure 11:
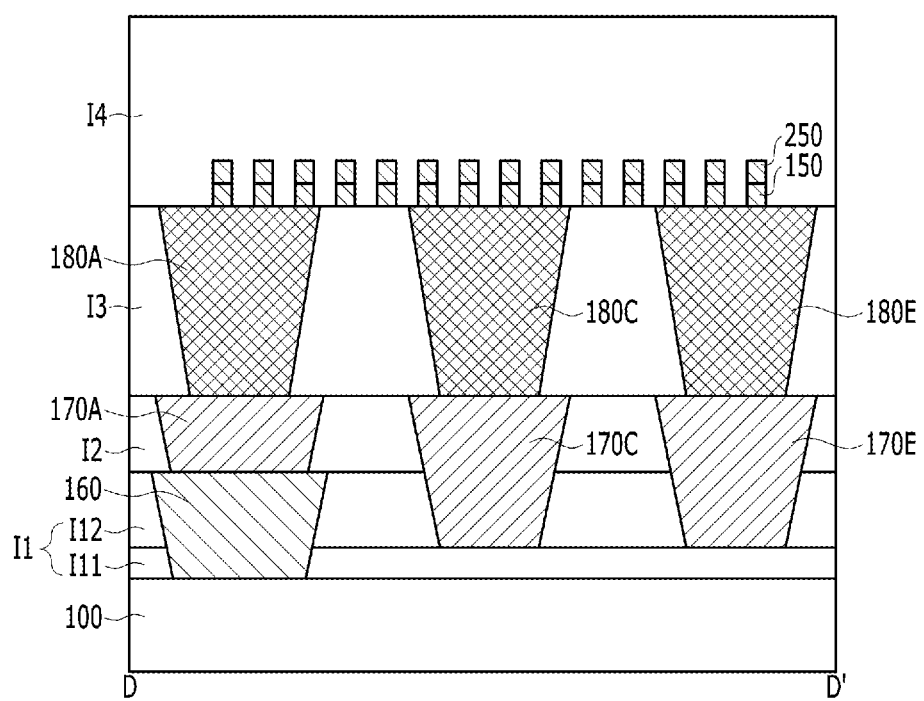

FIGS. 7 to 11 are views illustrating a semiconductor device according to another embodiment of the present disclosure. FIG. 7 is a plan view illustrating the semiconductor device according to the present embodiment, FIG. 8 is a cross-sectional view taken along a line A-A' of FIG. 7, FIG. 9 is a cross-sectional view taken along a line B-B' of FIG. 7, FIG. 10 is a cross-sectional view taken along a line C-C' of FIG. 7, and FIG. 11 is a cross-sectional view taken along a line D-D' of FIG. 7. Differences from the above-described embodiment of FIGS. 1 to 5 will be mainly described.

Referring to FIGS. 7 to 11, the semiconductor device according to the present embodiment may include a substrate 100, a plurality of first conductive lines 130 disposed over the substrate 100 and extending in a first direction substantially parallel to an upper surface of the substrate 100, a plurality of second conductive lines 150 disposed over the first conductive lines 130 and extending in a second direction substantially parallel to the upper surface of the substrate 100 and intersecting the first direction, a plurality of first memory cells 140 disposed between the first conductive lines 130 and the second conductive lines 150 in a vertical direction perpendicular to the first and the second directions and overlapping with intersection regions of the first conductive lines 130 and the second conductive lines 150, a plurality of third conductive lines 250 disposed over the second conductive lines 150 and extending in the second direction to overlap and be in contact with the second conductive lines 150, respectively, a plurality of fourth conductive lines 230 disposed over the third conductive lines 250 and extending in the first direction to overlap the first conductive lines 130, respectively, and a plurality of second memory cells 240 disposed between the third conductive lines 250 and the fourth conductive lines 230 in the vertical direction and overlapping with intersection regions of the third conductive lines 250 and the fourth conductive lines 230.

The second and the third conductive lines 150 and 250 contact each other, and thus they may perform the same function. For example, when each of the first conductive line 130 and the fourth conductive line 230 functions as a word line, the second and the third conductive lines 150 and 250 may function as a common bit line. Alternatively, when each of the first conductive line 130 and the fourth conductive line 230 functions as a bit line, the second and the third conductive lines 150 and 250 may function as a common word line. In another embodiment, the third conductive lines 250 may be omitted. In this case, the second memory cells 240 may be disposed between the second conductive lines 150 and the fourth conductive lines 230 and overlap intersection regions thereof.

The substrate 100, the first conductive line 130, the second conductive line 150, and the first memory cell 140 may be the same as corresponding components of the above-described embodiment shown in FIGS. 1 to 5. However, the memory cell 140 of the above-described embodiment shown in FIGS. 1 to 5 will be referred to as the first memory cell 140 in order to distinguish it from the second memory cell 240.

A contact structure 110 and 120 connected to the first conductive lines 130 and disposed under the first conductive lines 130 and a contact structure 160, 170, and 180 connected to the second conductive lines 150 and disposed under the second conductive lines 150 may be the same as the contact structures described in the above embodiment shown in FIGS. 1 to 5.

Since the third conductive lines 250 contact the second conductive lines 150, the same voltage or the same signal may be supplied to the third conductive lines 250 through the contact structure 160, 170, and 180 and the second conductive lines 150 as illustrated in FIGS. 10 and 11.

The fourth conductive lines 230 may receive the same voltage or the same signal from the substrate 100 through a contact structure 210, 220, and 222 as illustrated in FIGS. 8 and 9.

The contact structure 210, 220, and 222 may be disposed in the peripheral area PA at one side of the cell area CA in the first direction, for example, in the peripheral area PA at the right side of the cell area CA when viewed in the plan view of FIG. 7. In this case, in order not to overlap the contact structure 110 and 120 connected to the first conductive lines 130, the contact structure 210, 220, and 222 may be disposed farther from the cell area CA than the contact structure 110 and 120. Also, for disposition of the contact structure 210, 220, and 222, the fourth conductive lines 230 may further extend to the right compared to the first conductive lines 130, as illustrated in FIGS. 7 and 8.

The contact structure 210, 220, and 222 may include a lower contact 210, an intermediate contact 220, and an upper contact 222. Since the fourth conductive line 230 is positioned above the first conductive line 130 in the vertical direction perpendicular to the upper surface of the substrate 100, the contact structure 210, 220, and 222 connected to the fourth conductive lines 230 may have a three-layer structure, unlike the contact structure 110 and 120 having a two-layer structure. Except for this, the contact structure 210, 220, 222 may be similar to the contact structure 110 and 120. Hereinafter, the contact structure 210, 220, and 222 will be described with a focus on differences from the contact structure 110 and 120.

The upper contact 222 may have an upper surface in contact with a lower surface of the fourth conductive line 230 under the fourth conductive line 230. Each of a plurality of upper contacts 222 may be connected to two or more fourth conductive lines 230 arranged in the second direction by overlapping them in common. Furthermore, two upper contacts 222 closest to each other in the first and the second directions, among the plurality of upper contacts 222, may overlap and be connected to one or more fourth conductive lines 230 in common.

In the present embodiment, five upper contacts 222, that is, a first upper contact 222A, a second upper contact 222B, a third upper contact 222C, a fourth upper contact 222D, and a fifth upper contact 222E may be arranged sequentially from bottom to top in the second direction when viewed in the plan view of FIG. 7. In order for the two upper contacts 222 closest to each other to overlap and be in contact with one or more fourth conductive lines 230 in common, the two upper contacts 222 closest to each other may not be positioned on a straight line extending in the second direction, but may be positioned to be spaced apart from each other in the first direction.

For example, as illustrated in FIG. 7, the first to the fifth upper contacts 222A, 222B, 222C, 222D, and 222E may be arranged in a zigzag shape along the second direction. Thus, the first, the third, and the fifth upper contacts 222A, 222C, and 222E may be positioned on a straight line extending in the second direction, for example, the line B-B', and the second and the fourth upper contacts 222B and 222D may be positioned on another straight line extending in the second direction. Each of the upper contacts 222 may have a bar shape having a relatively long length in the second direction and a relatively short length in the first direction in a plan view, or a shape similar to the bar shape. That is, each upper contact 222 has a bar shape extending in the second direction.

The lower contact 210 may be disposed under at least one of the plurality of upper contacts 222. The lower contact 210 may have a lower surface in contact with the substrate 100, particularly in contact with a metal line of the substrate 100. The lower contact 210 may be electrically connected to the upper contact 222 via the intermediate contact 220 to be described later. When the lower contact 210 is disposed under one of the plurality of upper contacts 222, the lower contact 210 may not exist under the rest of the plurality of upper contacts 222. In the present embodiment, the case in which the lower contact 210 is disposed under the first upper contact 222A is illustrated in FIGS. 8 and 9.

In the present embodiment, the intermediate contact 220 may be disposed below each of the plurality of upper contacts 222. Referring to FIG. 7, first to fifth intermediate contacts 220A, 220B, 220C, 220D, and 220E are disposed to overlap and be connected to the first to the fifth upper contacts 222A, 222B, 222C, 222D, and 222E, respectively. Upper surfaces of the first to the fifth intermediate contacts 220A, 220B, 220C, 220D, and 220E may contact lower surfaces of the first to the fifth upper contacts 222A, 222B, 222C, 222D, and 222E, respectively, as illustrated in FIG. 9.

As described above, since the lower contact 210 is disposed under the first upper contact 222A, the first intermediate contact 220A may be interposed between the first upper contact 222A and the lower contact 210 in the vertical direction. On the other hand, the lower contact 210 may not exist under the second to the fifth intermediate contacts 220B, 220C, 220D, and 220E as illustrated in FIG. 9. However, the present disclosure is not limited thereto. In another embodiment, the remaining intermediate contacts 220B, 220C, 220D, and 220E, except for the first intermediate contact 220A overlapping and in contact with the lower contact 210, may be omitted. For example, at least one of the second to the fifth intermediate contacts 220B, 220C, 220D, and 220E may be omitted, i.e., may not be formed.

In the stacked structure of the lower contact 210, the first intermediate contact 220A, the first upper contact 222A, and the fourth conductive line 230 described above, a voltage or signal supplied from the substrate 100 may be transmitted to the fourth conductive line 230 via the lower contact 210, the first intermediate contact 220A, and the first upper contact 222A, The first to the fifth upper contacts 222A, 222B, 222C, 222D, and 222E and the first to the fifth intermediate contacts 220A, 220B, 220C, 220D, and 220E may form a kind of voltage or signal transfer chain so that the same voltage or the same signal may be transmitted to all of the fourth conductive lines 230.

Although not shown, when three layers of memory cells are stacked, a plurality of fifth conductive lines overlapping the second conductive lines 150 may be disposed over the fourth conductive lines 230 in the vertical direction. The plurality of fifth conductive lines may further extend toward the upper side of the cell area CA in the second direction compared to the second conductive lines 150 when viewed in the plan view of FIG. 7, and a contact structure connecting the plurality of fifth conductive lines to the substrate 100 may be disposed between the plurality of fifth conductive lines and the substrate 100 in the vertical direction. This contact structure may be the same as or similar to the contact structure 160, 170, and 180, except that it has a higher height than the contact structure 160, 170, and 180.

In this way, memory cells may be stacked in a plurality of layers, and contact structures commonly connected to additional conductive lines may be disposed.

According to the above embodiments of the present disclosure, it may be possible to reduce difficulty in the manufacturing of the semiconductor device and to reduce the area of the semiconductor device.

Although various embodiments have been described for illustrative purposes, it will be apparent to those skilled in the art that various changes and modifications may be made without departing from the spirit and scope of the present teachings as defined in the following claims.

What is claimed is:

1. A semiconductor device comprising:
a substrate;
a plurality of first conductive lines disposed over the substrate and extending in a first direction;
a plurality of second conductive lines disposed over or under the first conductive lines while being over the substrate, and extending in a second direction crossing the first direction, the first and the second directions being parallel to an upper surface of the substrate;
a plurality of memory cells disposed between the first conductive lines and the second conductive lines in a third direction perpendicular to the first and the second directions, and disposed in intersection regions of the first conductive lines and the second conductive lines, respectively; and
a contact structure disposed between the first conductive lines and the substrate in the third direction, and including a plurality of upper contacts and a lower contact, the plurality of upper contacts connected to the first conductive lines, the lower contact connected to the substrate and overlapping at least one of the plurality of upper contacts when viewed in a plan view,
wherein each of the plurality of upper contacts is in contact with at least two of the first conductive lines, and
wherein two upper contacts, which are closest to each other, among the plurality of upper contacts are commonly in contact with one or more of the plurality of first conductive lines.

2. The semiconductor device according to claim 1, further comprising:
an insulating material layer interposed between one of the plurality of upper contacts, which non-overlaps the lower contact, and the substrate.

3. The semiconductor device according to claim 2, wherein the insulating material layer has a lower etch rate than an insulating material filling spaces between the plurality of upper contacts.

4. The semiconductor device according to claim 1, wherein the two upper contacts, which are closest to each other, are located on different straight lines extending in the second direction.

5. The semiconductor device according to claim 1, wherein the plurality of upper contacts are arranged in a zigzag along the second direction.

6. The semiconductor device according to claim 1, wherein the plurality of upper contacts include odd-numbered upper contacts and even-numbered upper contacts that are alternately arranged along the second direction,
the odd-numbered upper contacts are positioned on a first straight line extending in the second direction, and
the even-numbered upper contacts are positioned on a second straight line extending in the second direction, the second straight line being spaced apart from the first straight line in the first direction.

7. The semiconductor device according to claim 1, wherein each of the plurality of upper contacts has a bar shape in which a length in the second direction is longer than a length in the first direction.

8. The semiconductor device according to claim 1, wherein a thickness of one of the plurality of upper contacts, which overlaps the lower contact, is smaller than a thickness of one of the plurality of upper contacts, which non-overlaps the lower contact.

9. The semiconductor device according to claim 1, wherein the same voltage or the same signal is transmitted to the plurality of first conductive lines through the lower contact and the plurality of upper contacts.

10. The semiconductor device according to claim 1, wherein the substrate includes a cell area in which the plurality of memory cells are arranged and a peripheral area disposed around the cell area, and
the contact structure is disposed in the peripheral area at one side of the cell area in the first direction.

11. The semiconductor device according to claim 1, wherein the contact structure is a first contact structure, the plurality of upper contacts are a plurality of first upper contacts, and the lower contact is a first lower contact, the semiconductor device further comprising:
a second contact structure disposed between the second conductive lines and the substrate in the third direction, and including a plurality of second upper contacts and a second lower contact, the plurality of second upper contacts connected to the second conductive lines, the second lower contact connected to the substrate and overlapping at least one of the plurality of second upper contacts when viewed in the plan view,
wherein the second contact structure is disposed in a peripheral area at one side of a cell area in the second direction, and
wherein the second contact structure further includes a first intermediate contact interposed between one of the plurality of second upper contacts, which overlaps the second lower contact, and the second lower contact.

12. The semiconductor device according to claim 11, wherein the second contact structure further comprises:
a second intermediate contact disposed below one of the plurality of second upper contacts, which non-overlaps the second lower contact.

13. The semiconductor device according to claim 12, further comprising:
an insulating material layer interposed between the second intermediate contact and the substrate.

14. The semiconductor device according to claim 13, wherein the insulating material layer has a lower etch rate than an insulating material filling a space between the first intermediate contact and the second intermediate contact.

15. The semiconductor device according to claim 12, wherein a thickness of the first intermediate contact is smaller than a thickness of the second intermediate contact.

16. The semiconductor device according to claim 12, wherein the plurality of second upper contacts have the same thickness as each other.

17. The semiconductor device according to claim 1, further comprising:
a plurality of third conductive lines disposed over the first conductive lines and extending in the first direction while respectively overlapping the first conductive lines when viewed in the plan view; and
a third contact structure disposed between the plurality of third conductive lines and the substrate, and including a plurality of third upper contacts and a third lower contact, the plurality of third upper contacts connected to the third conductive lines, the third lower contact connected to the substrate and overlapping at least one of the plurality of third upper contacts when viewed in the plan view,
wherein each of the plurality of third upper contacts is in contact with at least two of the plurality of third conductive lines, and
wherein two third upper contacts, which are closest to each other, among the plurality of third upper contacts are commonly in contact with one or more of the plurality of third conductive lines.

18. The semiconductor device according to claim 17, wherein the substrate includes a cell area in which the plurality of memory cells are arranged and a peripheral area disposed around the cell area,
the contact structure and the third contact structure are located in the peripheral area at one side of the cell area in the first direction, and
a distance between the third contact structure and the cell area is greater than a distance between the contact structure and the cell area.

19. The semiconductor device according to claim 1, further comprising:
a first intermediate contact interposed between one of the upper contacts, which overlaps the lower contact, and the lower contact.

20. The semiconductor device according to claim 19, further comprising:
a second intermediate contact disposed below one of the upper contacts, which does not overlap the lower contact.

21. The semiconductor device according to claim 20, further comprising:
an insulating material layer interposed between the second intermediate contact and the substrate.

22. The semiconductor device according to claim 20, wherein a thickness of the first intermediate contact is smaller than a thickness of the second intermediate contact.

23. The semiconductor device according to claim 20, wherein the upper contacts have the same thickness as each other.

* * * * *